July 18, 1961 F. R. NOLL 2,993,127
TRANSISTOR CIRCUIT HAVING REVERSE BASE CURRENT SUPPLY MEANS
Filed Dec. 4, 1957
Fig.1.
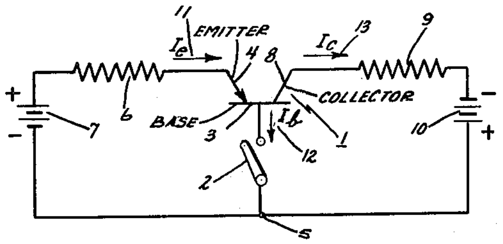
Fig.2.
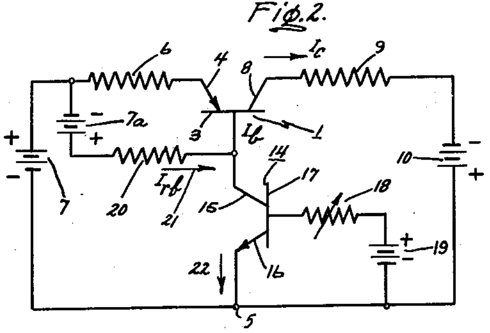
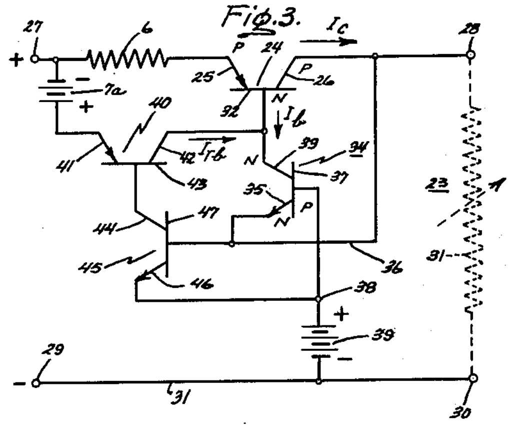
Fig.4.
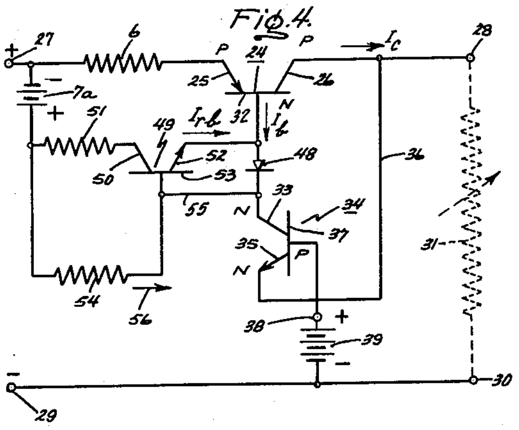
Fig.5.
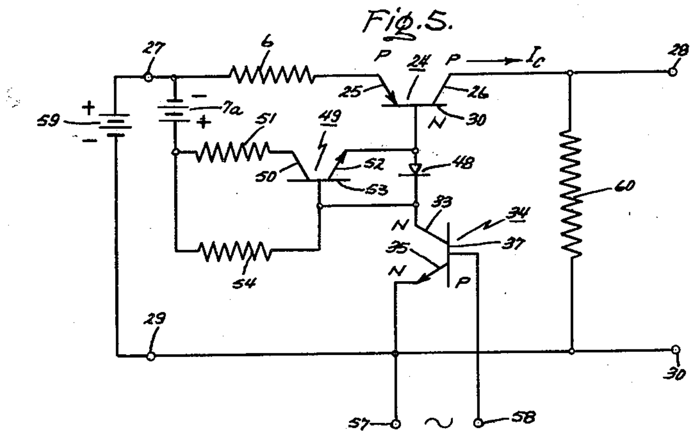
Inventor:
Frank R. Noll,
by Gust & Irish
Attorneys.

United States Patent Office 2,993,127

Patented July 18, 1961

2,993,127

TRANSISTOR CIRCUIT HAVING REVERSE BASE CURRENT SUPPLY MEANS

Frank R. Noll, Fort Wayne, Ind., assignor to International Telephone and Telegraph Corporation Filed Dec. 4, 1957, Ser. No. 700,596
13 Claims. (Cl. 307—88.5)

This invention relates to transistor circuitry, and more particularly to a transistor circuit in which base current in a direction opposite to the normal base current is supplied to the transistor in order to supply the $I_{co}$ requirement of the transistor without imposing a heavy power requirement on the base driving circuit of the transistor.

In direct coupled transistor circuits, i.e. those having no series capacitance in the base circuit, the collector current is normally controlled by the base current. However, in such circuits it is impossible completely to "turn off" the transistor, i.e. cut-off the collector current merely by opening the base circuit since a flow of emitter-to-collector leakage current, designated $I_{co}$, remains, this leakage current being amplified by the amplification factor (B) of the transistor thus providing collector current of substantial magnitude, even though the base circuit is open. It has been proposed to supply a back-bias on the base of the transistor, i.e. to supply a base current reversed from the normal direction of base current flow in order to cut off the emitter-base junction and it has been found that the emitter-collector leakage current can be completely cut off by this back-bias when such reverse base current is at least exactly equal to the $I_{co}$ requirements of the transistor; under these conditions the collector current with the base circuit of the transistor opened has a minimum value equal to the $I_{co}$ leakage current, but is not amplified by the transistor amplification factor since the emitter-base diode is cut off. Unfortunately, however, the $I_{co}$ for a given transistor varies widely with temperature and thus a reverse base current supply sufficient to satisfy the worst $I_{co}$ requirement may well be many times more than is necessary for the minimum $I_{co}$ requirement.

It is common in transistor circuitry to control the base circuit of a main transistor by another transistor having its collector and emitter serially connected with the base of the main transistor. Thus, in such a circuit with the heretofore described method of supplying reverse base current to satisfy the worst $I_{co}$ requirement of the transistor in order to turn off the main transistor, in those instances where a smaller $I_{co}$ is required the base or driving transistor for the main transistor must leak off the surplus current supplied by the reverse base current source in order to turn the transistor on. In transistor circuits controlling minute quantities of power, the fact that the driving transistor for the base of the main transistor is required to drain off the surplus reverse base current may not be serious. However, in circuits employing power transistors, this surplus reverse base current may be of substantial magnitude thus imposing an unduly heavy power requirement on the driving transistor; this may necessitate the use of a transistor of the power type as the driving transistor. It is therefore desirable to provide a transistor in which the requisite reverse base current for a main transistor is provided without imposing an unduly heavy power requirement on the base driving circuit.

It is therefore an object of this invention to provide an improved transistor circuit.

Another object of this invention is to provide an improved transistor circuit in which the requisite reverse base current is provided to satisfy the $I_{co}$ requirement of the transistor without imposing an unduly heavy power requirement on the base driving circuit.

A further object of this invention is to provide an improved transistor circuit in which full control of the collector current is maintained while the base current is controlled in either direction.

Yet another object of this invention is to provide an improved transistor circuit in which normal-direction base current is supplied when the collector current requirement is greater than $BI_{co}$ and reverse-direction base current is provided when the collector current requirement is less than $BI_{co}$, the respective normal and reverse base currents being controlled responsive to the external signal applied to the transistor.

My invention in its broader aspects provides a transistor having an emitter, a collector and a base with first means for supplying a normal-direction base current for the transistor when the collector current requirement thereof is greater than $BI_{co}$ and for controlling the normal-direction of base current responsive to an external signal. Means are also provided for supplying reverse-direction base current for the transistor when the collector current requirement thereof is less than $BI_{co}$, the reverse-direction base current supply means being controlled by the external signal to prevent the flow of reverse-direction base current when the normal-direction base current is being supplied, and to supply the reverse-direction base current responsive to a requirement of the external signal for collector current less than $BI_{co}$. In a specific embodiment of this invention, I provide a main transistor with its emitter and collector connected between a power source and the load and with its base serially connected with a diode and the emitter and collector of a driving transistor which supply the normal-direction base current for the main transistor. A signal input circuit is connected across the base and emitter of the driving transistor in order to control the normal-direction base current. Another transistor is provided having its collector and emitter serially connected between the power source and the base of the main transistor for providing the reverse-direction base current, this transistor having its base connected to the power source by a resistor and with its base further being connected to the collector of the driving transistor, so that the diode is shunted by the base and emitter of the other transistor. With this arrangement, so long as the input signal does not require a main transistor collector current less than $BI_{co}$, normal-direction base current will flow in the diode-driving transistor circuit and the other transistor will be cut-off. However, when the input signal requires a main transistor collector current less than $BI_{co}$, the other transistor is turned on thereby blocking the diode so that reverse-direction base current is supplied to the main transistor, this reverse-direction base current being still controlled by the driving transistor in repsonse to the input signal.

The above-mentioned and other features and objects of this invention and the manner of attaining them will become more apparent and the invention itself will be best understood by reference to the following description of an embodiment of the invention taken in conjunction with the accompanying drawings, wherein:

FIG. 1 is a schematic illustration of a direct coupled transistor circuit used in explaining the fundamentals of my invention;

FIG. 2 is another schematic diagram of a transistor circuit illustrating the prior method of supplying reverse-direction base current;

FIG. 3 is a schematic illustration showing one embodiment of my invention applied to a voltage regulating circuit;

FIG. 4 is a another schematic illustration showing the preferred embodiment of my invention also applied to a voltage regulating circuit; and FIG. 5 is yet another schematic illustration showing the embodiment of FIG. 4 applied to an amplifying circuit.

Referring now to FIG. 1, there is shown a basic direct coupled transistor circuit employing a PNP-type transistor 1 having a switch 2 connected in series with its base 3. It will be seen that the emitter 4 of the transistor 1 is serially connected to switch 2 at point 5 by a resistor 6 and a source of potential 7, and that collector 8 is likewise serially connected with switch 2 at point 5 with resistor 9 and source of potential 10. With the circuit shown, the emitter current, designated $I_e$, will flow in the direction shown by the arrow 11, the base current, designated $I_b$ will flow in the direction shown by the arrow 12, and the collector current, designated by the arrow $I_c$, will flow in the direction shown by the arrow 13. Furthermore, with this circuit, $$I_c = BI_b + \frac{B}{A} I_{co}$$

with switch 2 closed, and with B being the amplification factor of the transistor $$\left(\frac{I_c}{I_b}\right)$$

and A being the ratio of collector current to emitter current $$\left(\frac{I_c}{I_e}\right)$$

Considering now the situation with the switch 2 opened thus opening the circuit of base 3 of transistor 1, it is found that $$I_c = AI_e + I_{co} = I_e \frac{I_{co}}{1-A}$$

It is thus seen that even with the base circuit opened, collector current will flow, this collector current not being merely the leakage current $I_{co}$, but being the leakage current amplified by the amplification factor B, expressed as $BI_{co}$.

Referring now additionally to FIG. 2 in which like elements are indicated by like reference numerals, there is shown a circuit in which a driving transistor 14 of the NPN-type is employed with its collector 15 and emitter 16 serially connected between base 3 and point 5 and with its base 17 serially connected with variable resistor 18 and potential source 19 to point 5. Transistor 14, generally referred to as a base driving transistor, is used to control the normal base current $I_b$ of the main transistor 1 and thus as stated above, even though driving transistor 14 is turned off, the collector current $I_c$ of the transistor 1 cannot be turned off. In order therefore to reduce the collector current $I_c$ to a minimum value with the circuit of base 3 of transistor 1 open, a resistor 20 and bias source 7*a* has been connected between the positive side of power source 7 and the base 3 of transistor 1; it will be seen that with this circuit connection, reverse-direction base current identified as $I_{rb}$, will flow in the direction 21 into the base 3 of transistor 1, this current, if it is of sufficient magnitude, serving to back-bias the emitter-base junction (4—3) of transistor 1. As stated previously it has been found that the current $I_{rb}$ sufficient to back-bias the emitter-base diode of transistor 1 to cut-off the flow of leakage current therethrough is exactly sufficient to supply the $I_{co}$ component of current flowing in the collector circuit. However, it will be observed that this reverse base-collector current $I_{rb}$ does not flow in the emitter-collector circuit and is thus not amplified, and therefore the collector current of the transistor 1 may be maintained at a minimum value equal to $I_{co}$.

Consider now the case however when under the worst conditions, $I_{co}$ of transistor 1 is for example 10 milliamperes whereas in fact at a particular time, the $I_{co}$ requirement is only 1 milliampere. Resistor 20 of FIG. 2 must however be proportioned to supply the worst $I_{co}$ requirement for transistor 1, e.g. 10 milliamperes, and thus under the circumstances stated, supplies an excess $I_{rb}$ of 9 milliamperes. Thus, in order to "turn on" transistor 1, driving transistor 14 must drain off 9+ milliamperes from the circuit of resistor 20 thus leaving an $I_{rb}$ flowing into the base 3 of transistor 1 of 1− milliamperes; a deficiency in the reverse-direction base current below the $I_{co}$ requirement is made up by the flow of emitter-collector leakage current which will be amplified as seen above, and thus the transistor 1 is "turned on" in that collector current greater than the minimum $I_{co}$ current will flow when the reverse base current falls below 1 milliampere. It is thus seen that merely to turn on transistor 1, driving transistor 14 must pass 9 milliamperes, this 9 milliamperes current drain through driving transistor 14 being a constant burden on top of any normal-direction base current $I_b$ which may be drawn by driving transistor 14. It is thus seen that a driving transistor 14 must be provided having capacity adequate not only to pass the normal base current, but also the surplus reverse base current from the circuit of the resistor 20.

In order to provide a transistor circuit in which the driving transistor is not required to carry surplus reverse base current, reference will now be had to FIG. 3 which shows a voltage regulating circuit, generally identified as 23 incorporating a power transistor 24 of the PNP-type with its emitter 25 and collector 26 serially connected between input terminal 27 and load terminal 28. Input terminal 29 and load terminal 30 are connected together by conductor 31, as shown, input terminals 27 and 29 being adapted to be connected to an unregulated source of direct current potential (not shown) with input 27 being connected to the positive side of such source, and output terminals 28 and 30 being adapted to be connected to a load, shown here in dashed lines as variable resistor 31; in the present circuit, the nature of the load 31 is unimportant and it may be either a fixed or variable load having any desired impedance characteristics.

The base 32 of the power transistor 24 is connected to collector 33 of driving transistor 34, which is of the NPN-type and which has its emitter 35 connected to the collector 26 of the power transistor 24 by a conductor 36, conductor 36 constituting a feed-back connection as will be hereinafter described. The base 37 of the driving transistor 34 is connected to the positive terminal 38 of a suitable source of reference voltage, shown here as being battery 39.

In order to supply the reverse base current for the power transistor 24, a third transistor 40 is provided having its emitter 41 and collector 42 serially connected between the bias source 7*a* and base 32 of the power transistor 24. Transistor 40, which is of the PNP-type has its base 43 connected to the collector 44 of a fourth transistor 45 which is of the NPN-type. Transistor 45 has its emitter 46 connected to base 37 of the driving transistor 34 and has its base 47 connected to the emitter 35 of the driving transistor 34.

Assume now that the load 31 is suddenly reduced thus causing a tendency for the voltage appearing across output terminals 28 and 30 to increase, it will be seen that the emitter 35 of the driving transistor 34 will become more positive which is in a direction to turn off transistor 34 thus reducing the flow of normal-direction base currents $I_b$ from base 32 and in turn reducing the collector current $I_c$ in collector 26 of driving transistor 24 thereby to reduce the terminal voltage. Assuming now further that the load 31 is sufficiently reduced so that the load current flowing therethrough which is $I_c$ of the power transistor 24 plus the normal-direction base current, is sufficiently reduced that the collector current requirement falls below $BI_{co}$. The value of the reference source 39 is so set that under these circumstances, the driving transistor 34 will be cut off, thereby cutting off the normal-direction base current for the transistor 34. It will be noted, however, that the emitter 35 of the driving transistor 34 is connected to the base 47 of transistor 45 and thus the increase in potential of emitter 35 of driving transistor 34 responsive to the increase in potential sensed by the feed-back connection 36 in a direction to turn transistor 45 on. It will now also be noted that the emitter 46 of transistor 45 is also connected to the source of reference voltage 39 and thus, when driving transistor 34 is turned off responsive to a collector current requirement of power transistor 24 less than $BI_{co}$, transistor 45 is turned on. Turning on transistor 45 passes current to the base 43 of the transistor 40 which then turns on the transistor 40 so that a reverse base current $I_{rb}$ flows in the emitter-collector circuit 41—42 and thus into the base 32 of the power transistor 24. It will now be observed that the feed-back connection 36 is also connected to the base 47 of the transistor 45 and thus, the flow of reverse base current is controlled responsive to the demand for collector current, so long as that demand is less than $BI_{co}$. As soon as the demand for collector current from the power transistor 24 exceeds $BI_{co}$, the potential of the emitter 35 of the driving transistor 34 will fall sufficiently to turn on driving transistor 34 thereby to draw normal-direction base current from the base 32 of the power transistor 24 and simultaneously turning off transistors 45 and 40 thereby to prevent further flow of the reverse-direction base current $I_{rb}$.

Referring now to FIG. 4 in which like elements are indicated by like reference numerals, there is shown another voltage regulating circuit incorporating my invention in which one of the transistors of the circuit of FIG. 3 has been eliminated. Here, a diode 48 is serially connected between the collector 33 and base 32 of the power transistor 24 and is polarized in the direction to pass the normal base current $I_b$. Another transistor 49 of the NPN-type is provided having its collector 50 connected to the bias source *7a* by resistor 51 and having its emitter 52 connected to base 32 of the power transistor 24. The base 53 of transistor 49 is connected to the bias source *7a* by a resistor 54 and is also connected to the collector 33 of the driving transistor 34 by a connection 55; it will now be seen that the base 53 and emitter 52 of transistor 49 are arranged in shunt across the diode 48.

It will now be seen that when transistor 34 is drawing normal base current $I_b$ from base 32 of power transistor 24, it will also draw a current shown by the arrow 56 through the circuit of resistor 54 and connection 55. When the collector current requirement of power transistor 24 falls below the $I_{co}$, the current drawn through driving transistor 34 will have been reduced under the influence of the feed-back connection 36 and the reference potential 39 with the current 56 having been correspondingly reduced so that the voltage drop across resistor 54 has decreased sufficiently to raise the potential of base 53 of transistor 49 to turn transistor 49 on, thus blocking the diode 48. It will now be seen that the normal-direction base current $I_b$ is cut-off with reverse-direction base current $I_{rb}$ flowing into the base 32 of the power transistor 24. It will now further be seen that the flow of the reverse-direction base current $I_{rb}$ through the transistor 49 is now controlled by the driving transistor 34 responsive to the demand for power transistor collector current $I_c$ as sensed by the feed-back connection 36 and the reference source 39. When the demand for the driving transistor collector current $I_c$ exceeds $BI_{co}$, the voltage of emitter 35 of the driving transistor 34 will have fallen sufficiently to pass sufficient current 56 through the resistor 54 and connection 55 to provide a voltage drop across the resistor 54 such that transistor 49 is cut off, thereby cutting off the reverse-direction base current $I_{rb}$ into the base 32 of the power transistor 24 and simultaneously allowing diode 48 to conduct the normal-direction base current $I_b$ which is again under control of the driving transistor 34.

My improved transistor circuit is applicable to circuits other than voltage regulators, and in FIG. 5 there is shown an amplifier circuit employing the improved transistor circuit of FIG. 4. Here, with like elements being again indicated by like reference numerals, the feed-back loop 36 and reference source 39 of FIGS. 3 and 4 are eliminated and the emitter 35 and base 37 of the driving transistor 34 respectively connected across signal input terminals 57 and 58. The input terminals 27 and 29 of FIGS. 2 and 3 are then connected to a suitable source of potential, shown here as being battery 59 and a load resistor 60 is connected across the output terminals 28 and 30.

It will now be seen that in each of the embodiments of FIGS. 3, 4 and 5, the emitter 35 and base 37 of the driving transistor 34 constitute a signal-input circuit, this circuit being connected to an external signal-input source in FIG. 5 whereas in FIGS. 3 and 4, an error signal is provided across emitter 35 and base 37 by the reference source 39 and the feed-back connection 36. It will also be readily understood that the leakage current $I_{co}$ is present in transistors of the NPN-type as well as those of the PNP-type as described above, and that therefore the inability to turn off the transistor by opening the base circuit is equally present in the case of transistors of the NPN-type. It will therefore be readily apparent that in any of the figures of the drawing, where a transistor of one type is shown, a transistor of the opposite type may be substituted therefor; in FIG. 3 therefore with PNP-type transistors being shown as the power transistor 24 and transistor 40 and an NPN-type transistor being shown for the driving transistor 34 and the remaining transistor 47, NPN-type transistors may be utilized for driving transistor 24 and for transistor 40 and PNP-type transistors employed for the other two transistors. Likewise, in the circuits of FIGS. 4 and 5, the polarities of the transistors may be reversed from that shown, it being understood that if a transistor of the opposite type is substituted for the type shown, transistors of the opposite type must also be substituted for all of the other transistors in the circuit and all power and bias source polarities reversed.

It will now be readily seen that I have provided an improved transistor circuit in which reverse-direction base current is provided so that the collector current of a transistor may be reduced to a minimum value of $I_{co}$ without requiring the absorption of surplus reverse-direction base current in the driving circuit of the transistor. More particularly, I have provided a circuit in which the direction of base current for the transistor may be reversed responsive to the collector current requirement of the transistor with continuous control of the base current being maintained at all times.

While I have described above the principles of my invention in connection with specific apparatus, it is to be clearly understood that this description is made only by way of example and not as a limitation to the scope of my invention.

What is claimed is:

1. A transistor circuit comprising: a transistor having an emitter, a collector and a base; first means in series with said transistor base for supplying normal-direction base current for said transistor when the collector current requirement thereof is greater than $BI_{co}$ and for controlling said normal-direction base current responsive to an external signal; and second means connected to said transistor base for supplying reverse-direction base current for said transistor when the collector current requirement thereof is less than $BI_{co}$ and for controlling said reverse-direction base current responsive to said external signal, where $BI_{co}$ is the emitter-to-collector leakage current $I_{co}$ of said transistor amplified by the amplification factor B of said transistor.

2. A transistor circuit comprising: a transistor having an emitter, a collector and a base; first means in series with said transistor base for supplying normal-direction base current for said transistor when the collector current requirement thereof is greater than $BI_{co}$ and for controlling said normal-direction base current responsive to an external signal; second means connected to said transistor base for supplying reverse-direction base current for said transistor when the collector current requirement thereof is less than $BI_{co}$ and for controlling said reverse-direction base current responsive to said external signal; and means connecting said second means for control by said external signal to prevent flow of said reverse-direction base current when said first means is supplying said normal-direction base current to said transistor, and to supply said reverse-direction base current to said transistor responsive to a requirement of said external signal for a transistor collector current less than $BI_{co}$, where $BI_{co}$ is the emitter-to-collector leakage current $I_{co}$ of said transistor amplified by the amplification factor B of said transistor.

3. A transistor circuit comprising: a transistor having an emitter, a collector and a base; first variable impedance means in series with said transistor base for supplying normal-direction base current for said transistor when the collector current requirement thereof is greater than $BI_{co}$; signal input means coupled to said first variable impedance means for controlling said normal-direction base current responsive to an external signal; and means including second variable impedance means connected to said transistor base for supplying reverse-direction base current to said transistor when the collector current requirement thereof is less than $BI_{co}$ and for controlling said reverse-direction base current responsive to said external signal, said second variable impedance means being coupled to said first variable impedance means and having its impedance controlled responsive to said external signal so that said flow of said reverse-direction base current is prevented when said first variable impedance means is supplying said normal-direction base current to said transistor and said reverse-direction base current is supplied to said transistor responsive to a requirement of said external signal for a transistor collector current less than $BI_{co}$, where $BI_{co}$ is the emitter-to-collector leakage current $I_{co}$ of said transistor amplified by the amplification factor B of said transistor.

4. A transistor circuit comprising: a transistor having an emitter, a collector and a base; a first current control element coupled to the base of said transistor for supplying normal-direction base current for said transistor when the collector current requirement thereof is greater than $BI_{co}$; signal input means coupled to said first circuit control element for controlling said normal-direction base current responsive to an external signal; and means including another current control element connected to the base of said transistor for supplying reverse-direction base current for said transistor when the collector current requirement thereof is less than $BI_{co}$ and for controlling said reverse-direction base current responsive to said external signal; said other current control element being coupled to said first current control element and controlled in response to said external signal so that flow of said reverse-direction base current is prevented when said first current control element is supplying said normal-direction base current to said transistor and said reverse-direction base current is supplied to said transistor responsive to a requirement of said external signal for a transistor collector current less than $BI_{co}$, where $BI_{co}$ is the emitter-to-collector leakage current $I_{co}$ of said transistor amplified by the amplification factor B of said transistor.

5. A direct-coupled transistor circuit comprising: a main transistor having its emitter and collector respectively adapted to be connected to a source of potential and to a load; a driving transistor for said main transistor having its collector and emitter connected in series with the base of said main transistor for supplying normal-direction base current for said main transistor when the collector current requirement thereof is greater than $BI_{co}$; a signal input circuit connected across the base and emitter of said driving transistor and adapted to be connected to an input signal source so that said driving transistor controls said normal-direction base current of said main transistor; and means including a third transistor having its collector and emitter connected in circuit between a source of bias potential and said main transistor base for supplying reverse-direction base current for said main transistor when the collector current requirement thereof is less than $BI_{co}$, said third transistor having its base connected in circuit with said driving transistor and being turned off thereby when said driving transistor is supplying said normal-direction base current to said main transistor, said third transistor being turned on to supply and control said reverse-direction base current to said main transistor responsive to a requirement of said input signal for a main transistor collector current less than $BI_{co}$, where $BI_{co}$ is the emitter-to-collector leakage current $I_{co}$ of said transistor amplified by the amplification factor B of said main transistor.

6. A transistor circuit comprising: a transistor having an emitter, a collector and a base; first variable impedance means for supplying normal-direction base current for said transistor when the collector current requirement thereof is greater than $BI_{co}$; signal input means coupled to said first variable impedance means for controlling said normal-direction base current responsive to an external signal; and means including second variable impedance means for supplying reverse-direction base current to said transistor when the collector current requirement thereof is less than $BI_{co}$ and for controlling said reverse-direction base current responsive to said external signal; said second variable impedance means being coupled to said first variable impedance means and signal input means, said second variable impedance means having its impedance controlled by said signal input means to prevent flow of said reverse base current when said first variable impedance means is supplying said normal base current; said first variable impedance means preventing flow of said normal-direction base current and said signal input means varying the impedance of said second variable impedance means to supply said reverse-direction base current responsive to a requirement of said external signal for a transistor collector current less than $BI_{co}$, where $BI_{co}$ is the emitter-to-collector leakage current $I_{co}$ of said transistor amplified by the amplification factor B of said transistor.

7. A transistor circuit comprising: a transistor having an emitter, a collector and a base; first variable impedance means coupled to the base of said transistor for supplying normal-direction base current thereto when the collector current requirement thereof is greater than $BI_{co}$; signal input means coupled to said first variable impedance means for controlling said normal direction base current responsive to an external signal; second variable impedance means coupled to the base of said transistor for supplying reverse-direction base current thereto when the collector current requirement thereof is less than $BI_{co}$ and third variable impedance means coupled to said second variable impedance means for controlling said reverse-direction base current; said third variable impedance means being coupled to said signal input means and having its impedance controlled thereby to prevent flow of said reverse-direction base current in said second variable impedance means when said first variable impedance means is supplying said normal-direction base current; said first variable impedance means preventing flow of said normal-direction base current therein and said signal input means varying the impedance of said third variable impedance means to cause said second variable impedance means to supply said reverse-direction current responsive to a requirement of said external signal for a transistor base current less than $BI_{co}$, where $BI_{co}$ is the emitter-to-collector leakage current $I_{co}$ of said transistor amplified by the amplification factor B of said transistor.

8. A transistor circuit comprising: a main transistor having its emitter and collector respectively adapted to be connected to a source of potential and to a load; a driving transistor for said main transistor having its collector and emitter connected in series with the base of said main transistor for supplying normal-direction base current for said main transistor when the collector current requirement thereof is greater than $BI_{co}$; a signal input circuit connected across the base and emitter of said driving transistor and adapted to be connected to an input signal source so that said driving transistor controls said normal-direction base current of said main transistor; a third transistor having its collector and emitter adapted to be connected in circuit between a source of bias potential and said main transistor base for supplying reverse-direction base current for said main transistor when the collector current requirement thereof is less than $BI_{co}$; and a fourth transistor having its collector connected to the base of said third transistor, its emitter connected to the base of said driving transistor and its base connected to the emitter of said driving transistor whereby said third and fourth transistors are turned off preventing flow of said reverse-direction base current when said driving transistor is supplying said normal-direction base current and said driving transistor is turned off and said third and fourth transistors are turned on to supply said reverse-direction base current responsive to a requirement of said input signal for a main transistor collector current less than $BI_{co}$, where $BI_{co}$ is the emitter-to-collector leakage current $I_{co}$ of said transistor amplified by the amplification factor B of said transistor and to control said reverse-direction base current responsive to said input signal.

9. The combination of claim 8 in which said main and third transistors are of one polarity type and said driving and fourth transistors are of the other polarity type.

10. A transistor circuit comprising: a transistor having an emitter, a collector and a base; first variable impedance means coupled to the base of said transistor for supplying normal-direction base current thereto when the collector current requirement thereof is greater than $BI_{co}$; diode means connected in series between said first variable impedance means and said transistor base for passing only said normal-direction base current; signal input means coupled to said first variable impedance means for controlling said normal-direction base current responsive to an external signal; and means including second variable impedance means coupled to said transistor base for supplying reverse-direction base current to said transistor when the collector current requirement thereof is less than $BI_{co}$ and for controlling said reverse-direction base current responsive to said external signal; said second variable impedance means being coupled to said first variable impedance means so that flow of said reverse-direction current is prevented when said first variable impedance means and said diode are supplying said normal-direction base current and said second variable impedance means supplies said reverse-direction base current in response to a requirement of said external signal for a transistor collector current less than $BI_{co}$, where $BI_{co}$ is the emitter-to-collector leakage current $I_{co}$ of said transistor amplified by the amplification factor B of said transistor.

11. A transistor circuit comprising: a transistor having an emitter, a collector and a base; first variable impedance means coupled to the base of said transistor for supplying normal-direction base current thereto when the collector current requirement thereof is greater than $BI_{co}$; diode means connected in series between said first variable impedance means and said transistor base for passing only said normal-direction base current; signal input means coupled to said first variable impedance means for controlling said normal-direction base current responsive to an external signal; second variable impedance means coupled to said transistor base for supplying reverse-direction base current to said transistor when the collector current requirement thereof is less than $BI_{co}$ and for controlling said reverse-direction base current responsive to said external signal; and a circuit for biasing said second variable impedance means in a direction to supply said reverse-direction base current, said circuit being coupled to said first variable impedance means so that flow of said reverse-direction current is prevented when said first variable impedance means and said diode are supplying said normal-direction base current and said second variable impedance means supplies said reverse-direction base current in response to a requirement of said external signal for a transistor collector current less than $BI_{co}$, where $BI_{co}$ is the emitter-to-collector leakage current $I_{co}$ of said transistor amplified by the amplification factor B of said transistor.

12. A transistor circuit comprising: a main transistor having its emitter and collector respectively adapted to be connected to a source of potential and to a load; a driving transistor for said main transistor having its collector and emitter connected in series with the base of said main transistor for supplying normal-direction base current for said main transistor when the collector current requirement thereof is greater than $BI_{co}$; a diode connected in series between said main transistor base and said driving transistor collector for passing only said normal-direction base current; a signal input circuit connected across the base and emitter of said driving transistor and adapted to be connected to an input signal source so that said driving transistor controls said normal-direction base current of said main transistor responsive to said input signal; a third transistor having its emitter and collector adapted to be serially connected across a source of bias potential and said main transistor base for supplying reverse-direction base current for said main transistor when the collector current requirement thereof is less than $BI_{co}$ and for controlling said reverse-direction base current responsive to said input signal; and a resistance adapted to be connected between said bias potential source and said third transistor base; said third transistor base being connected to said driving transistor collector so that said third transistor is turned off preventing flow of said reverse-direction base current when said driving transistor and said diode are supplying said normal-direction base current and said third transistor is turned on to supply said reverse-direction base current in response to a requirement of said input signal for a main transistor collector current less than $BI_{co}$, where $BI_{co}$ is the emitter-to-collector leakage current $I_{co}$ of said main transistor amplified by the amplification factor B of said transistor.

13. The combination of claim 11 in which said main transistor is of one polarity type and said driving and third transistors are of the other polarity type.

References Cited in the file of this patent

UNITED STATES PATENTS

| | | |
|---|---|---|
| 2,655,609 | Shockley | Oct. 13, 1953 |
| 2,878,440 | Jones | Mar. 17, 1959 |
| 2,892,143 | Sommer | June 23, 1959 |

UNITED STATES PATENT OFFICE

CERTIFICATE OF CORRECTION

Patent No. 2,993,127 July 18, 1961

Frank R. Noll

It is hereby certified that error appears in the above numbered patent requiring correction and that the said Letters Patent should read as corrected below.

Column 9, line 37, after "said" insert -- main --.

Signed and sealed this 20th day of February 1962.

(SEAL)
Attest:

ERNEST W. SWIDER
Attesting Officer

DAVID L. LADD
Commissioner of Patents